United States Patent
Seko

(10) Patent No.: US 7,304,394 B2
(45) Date of Patent: Dec. 4, 2007

(54) SEMICONDUCTOR DEVICE AND METHOD FOR MANUFACTURING SAME

(75) Inventor: Toshiharu Seko, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/100,541

(22) Filed: Apr. 7, 2005

(65) Prior Publication Data

US 2005/0224939 A1 Oct. 13, 2005

(30) Foreign Application Priority Data

Apr. 8, 2004 (JP) ............... 2004-114683

(51) Int. Cl.
*H01L 23/52* (2006.01)
*H01L 23/48* (2006.01)
*H01L 29/40* (2006.01)

(52) U.S. Cl. .................. 257/784; 257/E21.519; 257/678; 257/780; 257/782; 257/778; 438/111; 438/612; 156/73.1

(58) Field of Classification Search ........ 257/E23.065, 257/E23.068, 780, 782, 784, 778, 678, E21.503, 257/E21.511, E21.514, E21.519, E23.07; 156/73.1; 438/612, 123, 111
See application file for complete search history.

(56) References Cited

U.S. PATENT DOCUMENTS

| | | | | |
|---|---|---|---|---|
| 3,733,685 A | * | 5/1973 | Kauppila ............... | 228/110.1 |
| 5,118,370 A | * | 6/1992 | Ozawa ................. | 156/73.1 |
| 5,326,428 A | * | 7/1994 | Farnworth et al. ...... | 324/724 |
| 5,541,525 A | * | 7/1996 | Wood et al. ............ | 324/755 |
| 5,844,418 A | * | 12/1998 | Wood et al. ............ | 324/755 |
| 6,037,786 A | * | 3/2000 | Palagonia .............. | 324/754 |
| 6,333,555 B1 | * | 12/2001 | Farnworth et al. ...... | 257/737 |
| 6,414,506 B2 | * | 7/2002 | Akram et al. .......... | 324/765 |
| 6,664,133 B2 | * | 12/2003 | Abe et al. ............. | 438/111 |
| 6,828,812 B2 | * | 12/2004 | Farnworth et al. ...... | 324/757 |
| 2004/0094846 A1 | | 5/2004 | Yamada et al. ......... | 257/782 |
| 2004/0227256 A1 | | 11/2004 | Seko ................... | 257/784 |

FOREIGN PATENT DOCUMENTS

| | | |
|---|---|---|
| JP | 60-262430 A | 12/1985 |
| JP | 63-151033 A | 6/1988 |
| JP | 11-251363 | 9/1999 |
| JP | 2001-176918 A | 6/2001 |
| JP | 2001-223243 | 8/2001 |
| JP | 2003-152024 | 5/2003 |
| JP | 2004-140331 | 5/2004 |
| JP | 2004-342903 A | 12/2004 |

OTHER PUBLICATIONS

Japanese Office Action dated Apr. 18, 2006.

* cited by examiner

*Primary Examiner*—Kenneth Parker
*Assistant Examiner*—Chris C. Chu
(74) *Attorney, Agent, or Firm*—Harness, Dickey & Pierce, P.L.C.

(57) ABSTRACT

A wiring pattern is provided on an insulating tape. Part of the wiring pattern is a connection section. An insulating resin is provided so that the connection section is coated with the insulating resin. A protrusion electrode of a semiconductor element is so positioned on the connection section so that the protrusion electrode will push away the insulating resin and be connected with the connection section. Then, the semiconductor is pressed in Direction D1. Heat is applied while pressing in Direction D1. In this way, the connection section intrudes into the protrusion electrode, thereby causing the connection section and the protrusion electrode to be connected with each other.

11 Claims, 13 Drawing Sheets

PRIOR ART

US 7,304,394 B2

SEMICONDUCTOR DEVICE AND METHOD FOR MANUFACTURING SAME

This Nonprovisional application claims priority under 35 U.S.C. § 119(a) on Patent Application No. 2004/114683 filed in Japan on Apr. 8, 2004, the entire contents of which are hereby incorporated by reference.

FIELD OF THE INVENTION

The present invention relates to a semiconductor device and a method for manufacturing the same, more particularly, to a semiconductor device prepared by mounting, by means of bonding, a semiconductor element on a flexible wiring substrate that is called COF (Chip ON Film), and a method for manufacturing the same.

BACKGROUND OF THE INVENTION

Conventionally, a TCP (Tape Carrier Package) is known as an example of a semiconductor device prepared by mounting a semiconductor element on a flexible wiring substrate by bonding. In TCP, an opening section is formed in advance in that portion of an insulating tape on which the semiconductor element is to be mounted, the opening section penetrating through the insulating tape. The semiconductor element is connected with a tip portion of a wiring pattern cantilevered over the opening section.

Recently, a COF (Chip On Film) (hereinafter, just referred to as a COF) is another example of a semiconductor prepared by mounting a semiconductor element on a flexible wiring substrate. Use of the COF is increasing. The COF has no opening section for mounting the semiconductor element: in COF the semiconductor is mounted by being bonded on a surface of a thin insulating tape.

Purposes of usage of the COF requires the flexible wiring substrate of the COF to be, for example, a thin insulting film that can be freely bended. Each wire of the wiring pattern provided on a surface of the thin film insulating tape is electrically connected with a corresponding terminal of the semiconductor element. Moreover, an external connection section of the thin film insulating tape is connected with a liquid crystal panel, a printed substrate, or the like. The other portion of the wiring pattern is an exposed portion thereof. The exposed portion of the wiring pattern is coated with a solder resist, thereby to be insulated.

At present, the use of COF is increasing, so as to allow to increase a number of pins. Because the semiconductor is also required to be smaller and thinner, the thin film insulting tape of the COF should be so configured that (i) a connection section through which the thin film insulating tape is connected with the semiconductor and (ii) the external connection section of the wiring pattern are fine-pitched, and that the thin film insulating tape and the wiring pattern are thinner. In order to have a smaller pitch of inner leads, the inner leads should have a smaller width and thinner thickness.

An example (conventional Example 1) of a method for manufacturing a COF 31 is explained below, referring to FIGS. 11(a) to 11(e). In this method, thermocompression bonding is adopted. (cf. Japanese Patent Application Publication No. 2001-176918 (Tokukai 2001-176918; published on Jun. 29, 2001; hereinafter referred to as Patent Document 1).

In FIG. 11(a), A wiring pattern 22 is illustrated. The wiring pattern 22 provided on a thin film insulating tape 21 is prepared by plating Au on a Ni background prepared by plating. The pattern 22 has a connection section 24. A resist 25 is so applied on the pattern 22 that the connection 24 is left exposed. As illustrated in FIG. 11(b), a protrusion electrode 26 is positioned on the connection section 24 of the wiring pattern 22. The protrusion electrode 26 is an Au bump.

As illustrated in FIG. 11(c), the semiconductor element 23 and the wiring pattern 22 of the thin film insulating tape 21 are bonded by thermocompression bonding performed at a high temperature in a range of 400° C. to 450° C. with a pressure in a range of 0.1 to 0.3N per bump, the pressure applied along direction D6. With this, the wiring pattern 22 is bonded such that the protrusion electrode 26 is intruded into the wiring pattern 22. A diffusion layer or an alloy layer is formed at a portion 32, at which the wiring pattern 22 and the protrusion electrode 26 are bonded.

After that, an under-fill resin 27 is introduced in a gap between the semiconductor element 23 and the thin film insulating tape 21 by causing the under-fill resin 27 to flow in direction D7 from a nozzle 30, as illustrated in FIG. 11(d). As illustrated in FIG. 11(e), the under-fill resin 27 is thermoset by heat application D8, thereby firmly bonding the semiconductor 23 and the thin film insulating tape 21.

The thermocompression bonding has several problems.

One of the problems is the use of high temperature of 400° C. or more in bonding. This causes a significant expansion/shrinkage in the wiring pattern at the connection section due to thermal expansion, thermal shrinkage, and moisture absorption and dehydration. This results in cumulative dimensional error in the connection section of the wiring pattern, causing connection failure more liable.

Moreover, the use of high pressure is also a problem. The application of high pressure likely causes deformation of the wiring pattern at the connection section so that the wiring pattern is deformed by the semiconductor element around the protrusion electrode of the semiconductor element. This likely causes defect caused by touching (edge touch) of the wiring pattern with the semiconductor.

These problems become more sever when the connection section is fine-pitched and the wiring pattern becomes thinner, which are objects of the use of COF.

To cope with these problems, another examples of the method for manufacturing COF are known for bonding and sealing: an MBB (Micro Bump Bonding), an NCP (Non Conductive Paste), an ACP (Antisotropic Conductive Paste), and the like (hereinafter they are referred to as NCP and the like methods. The MBB is conventionally well known. Much attention is paid to the NCP and ACP, recently.

These NCP and the like methods allow bonding at low temperature: an insulating resin is intervened between a semiconductor and an insulating tape (flexible wiring substrate) and a protrusion electrode of the semiconductor element and a wiring pattern of the flexible wiring substrate are bonded together and sealed with the insulating resin at the same time. The NCP and the like methods are effective for attaining fine-pitched and thin wiring pattern to allow the wiring pattern to have a large number of pins. The NCP and the like methods are also effective for preventing the "edge touch", which is likely caused in such fine-pitched and thin wiring pattern. Many studies have be made on the NCP and the like methods.

For example, manufacturing methods adopting MBB are disclosed in Japanese Patent Application Publication No. 60-262430 (Tokukaisho No. 60-262430, published on Dec. 25, 1985; hereinafter Patent Document 2), Japanese Patent Application Publication No. 63-151033 (Tokukaisho No. 60-262430, published on Jun. 23, 1988; hereinafter Patent Document 3), and the like.

The manufacturing method (hereinafter Conventional Example 2) disclosed in Patent Document 2 is explained below, referring to FIGS. 12 and 13(a)-13(d). FIGS. 13(a)-13(d) are cross sectional views taken on C-C of a plane views of FIG. 12. Hereinafter, members having the same function as the conventional Example 1 are labeled with the same reference numerals.

In conventional Example 2, a photocuring or thermosetting resin 27 is applied on a wiring pattern 22 of a wiring substrate (insulating tape) firstly as illustrated in FIGS. 13(a) and 13(b).

Next, as illustrated in FIG. 13(c), a protrusion electrode 26 is positioned on a connection section 24 of the wiring pattern 22 and then pressed in Direction D9. With this, the resin 27 between the protrusion electrode 26 and the wiring pattern 22 is pushed away in Direction D10, thereby to attain an electric connection simply by pressing the protrusion electrode 26 to be in contact with the connection section 24 of the wiring pattern 22. This also causes the resin 27 to reach a circumference of the semiconductor 23.

After that, as illustrated in FIG. 13(d), the resin 27 is exposed to light or heated as indicated by Direction D11, thereby photocuring/thermosetting the resin 27. In this way, the semiconductor 23 and the wiring substrate 21 are firmly bonded. In case of the thermal curing, the heat applied is 150° C. or lower.

Next, the manufacturing method (conventional method 3) disclosed in Patent Document 3 is explained below, referring to FIGS. 12 and 14(a)-14(d). In this case again, FIGS. 14(a)-14(d) are cross sectional views taken on C-'C of the plane view of FIG. 12.

In the conventional Example 3, as illustrated in FIGS. 14(a) and 14(b), a thermosetting resin 27 is applied on a wiring pattern 22 of the wiring substrate 21.

After that, as illustrated in FIG. 14(c), a protrusion electrode 26 is positioned on a connection section 24 of the wiring pattern 22, so that the protrusion electrode 26 is in contact with the connection section 24. Then, the semiconductor 23 is pressed (in Direction D9) toward the wiring substrate 21 by using a pulse heating tool.

Then, as illustrated in FIG. 14(d), after the resin 27 on the wiring pattern 22 is pushed away to a circumference of the connection section, electricity is supplied to a pulse heating tool with pressure applied on the semiconductor element 23 in Direction 12. With this, the semiconductor element 23 is heated with a temperature of 100 to 250° C., thereby curing the resin 27. This causes the semiconductor element 23 to be firmly bonded with the wiring substrate 21 and causes the protrusion electrode 26 to be electrically connected with the wiring pattern 22.

The arrangements of the NCP and the like methods, however, have problem in that no sufficient connection strength can be achieved with the NCP and the like methods.

In the NCP and the like method, the protrusion electrode of the semiconductor element and the wiring pattern of the thin film insulating tape are connected only by (i) the contact caused by the pressure application and by (ii) the shrinkage of the cured resin. Therefore, the connection strength (connection reliability) is low in the NCP and the like methods.

Because of this, if, after mounting, the semiconductor device is put under a usage environment, for example, in which the semiconductor is repeatedly exposed to a low temperature and high temperature, the insulating resin might be peeled off from the thin film insulating tape or from the semiconductor element due to a force occurred due to a difference between materials of the thin film insulating tape, semiconductor element, and the insulating resin when thermal expansion and thermal shrinkage are repeated as a result of the temperature cycle. Moreover, if the semiconductor device is put under a highly humid environment after mounting and moisture absorption and expansion are repeated, the peeling-off may similarly occur. The peeling-off causes poor electric connection between the thin film insulating tape of the wiring pattern and the protrusion electrode of the semiconductor element.

The poor connection results in poor yield, thereby leading to high production cost.

SUMMARY OF THE INVENTION

In view of the aforementioned problems, an object of the present invention is to provide a semiconductor device and a method for manufacturing the same, the semiconductor device having improved bonding reliability between a protrusion electrode and a wiring pattern of a thin film insulating tape, and yield.

In order to attain the aforementioned object, a semiconductor device present invention is arranged to include an insulating tape on which a plurality of wiring patterns are provided; a semiconductor element having protrusion electrodes that are respectively electrically connected with the insulting tape via the corresponding wiring patterns; an insulating resin provided between the semiconductor element and the insulating tape; and connection sections (i) respectively provided in those facing regions of the wiring patterns which respectively faces the corresponding protrusion electrodes, and (ii) connected with the corresponding protrusion electrodes in such a manner that the connection sections deform and intrude into the corresponding protrusion electrodes, while pushing away the insulating resin.

In the semiconductor device having the above arrangement, the wiring patterns are provided on the insulating tape. To the wiring patterns, the protrusion electrodes of the semiconductor element are respectively connected. The insulating tape is a thin film insulating tape. The insulating tape is connected, e.g. with an external connection terminal, to which the wiring patterns are connected. By accessing to the external connection terminal of the insulating tape, it is possible to access to the semiconductor element via the wiring patterns.

The wiring patterns of the insulating tape are respectively provided with the connection sections which are to intrude respectively into the protrusion sections of the semiconductor element, deforming the protrusion sections. The insulating resin is provided between the semiconductor element and the insulating tape. The insulating resin is applied, for example, in such a manner that the connection sections of the insulating tape is coated with the insulating resin.

Then, the semiconductor element and the insulating tape thus prepared are bonded together by applying pressure. For example, the protrusion electrodes are positioned to face the connection sections of the insulating tape, respectively. Then, the pressure is applied on the semiconductor element. With this, the connection sections pushed away the insulating resin provided between the protrusion electrodes and the connection sections, and intrude into the protrusion electrodes, deforming the protrusion electrodes, thereby to be electrically connected with the protrusion electrodes.

With this arrangement, the wiring patterns and the protrusion electrodes are not only in contact with each other as a result of the pressure application: the connection is associated with deformation of the protrusion electrodes. This causes the writing patterns to be connected with the protrusion electrodes having a complex shape, thereby increasing connection area and thus attaining a firm connection.

Moreover, the insulating resin intervenes between the semiconductor element and the insulating tape in connecting the wiring pattern and the protrusion electrode. This prevents the semiconductor element and the insulating tape to be connected at an undesirable location except the region where the protrusion electrode and the connection section face each other. This prevents a defect caused by edge touch.

Moreover, in this arrangement, the bonding does not require high temperature of 400° C. or more. Therefore, no unnecessary shrinkage of the wiring patterns in the connection section occurs. This prevents cumulative dimensional error in the wiring pattern, and connection defect caused thereby.

Therefore, with this arrangement, it is possible to solve both the problems associated with the bonding of the thermocompression method and the low-temperature bonding method such as the NCP and the like methods.

In order to attain the object, a method of the present invention for manufacturing a semiconductor device comprising (i) an insulating tape on which a plurality of wiring patterns are provided, and (ii) a semiconductor element having protrusion electrodes that are to be respectively electrically connected with the insulting tape via the wiring patterns, is so arranged as to include (a) preparing connection sections respectively in those facing regions of the wiring patterns which respectively face the corresponding protrusion electrodes, and providing an insulating resin between the semiconductor element and the insulating tape; and (b) connecting the connection sections respectively with the corresponding protrusion electrodes in such a manner that the connection sections respectively deform and intrude into the corresponding protrusion electrodes, while pushing away the insulating resin.

With this method, it is possible to manufacture the aforementioned semiconductor device, and attain the same effect. A COF semiconductor device can be manufactured by using this method. Moreover, a semiconductor module device can be manufactured by using the COF semiconductor device.

For a fuller understanding of the nature and advantages of the invention, reference should be made to the ensuing detailed description taken in conjunction with the accompanying drawings.

BRIEF DESCRIPTION OF THE DRAWINGS

FIG. 2(*c*) is a cross sectional view illustrating a different state from that illustrated in FIG. 2(*a*).

FIG. 2(*d*) is a cross sectional view illustrating a different state from that illustrated in FIG. 2(*a*).

FIG. 4(*b*) is a cross sectional view illustrating a different state from that illustrated in FIG. 4(*a*).

FIG. 4(*c*) is a cross sectional view illustrating a different state from that illustrated in FIG. 4(*a*).

FIG. 4(*d*) is a cross sectional view illustrating a different state from that illustrated in FIG. 4(*a*).

FIG. 4(*e*) is a cross sectional view illustrating a different state from that illustrated in FIG. 4(*a*).

FIG. 6(*b*) is a cross sectional view illustrating a different state from that illustrated in FIG. 6(*a*).

FIG. 6(*c*) is a cross sectional view illustrating a different state from that illustrated in FIG. 6(*a*).

FIG. 6(*d*) is a cross sectional view illustrating a different state from that illustrated in FIG. 6(*a*).

FIG. 10(*b*) is a cross sectional view illustrating a different state from that illustrated in FIG. 10(*a*).

FIG. 10(*c*) is a cross sectional view illustrating a different state from that illustrated in FIG. 10(*a*).

FIG. 10(*d*) is a cross sectional view illustrating a further different state.

FIG. 11(*b*) is a cross sectional view illustrating a different state from that illustrated in FIG. 11(*a*).

FIG. 11(*c*) is a cross sectional view illustrating a different state from that illustrated in FIG. 11(*a*).

FIG. 11(*d*) is a cross sectional view illustrating a different state from that illustrated in FIG. 11(*a*).

FIG. 11(*e*) is a cross sectional view illustrating a different state from that illustrated in FIG. 11(*a*).

FIG. 13(*b*) is a cross sectional view illustrating a different state from that illustrated in FIG. 13(*a*).

FIG. 13(*c*) is a cross sectional view illustrating a different state from that illustrated in FIG. 13(*a*).

FIG. 13(*d*) is a cross sectional view illustrating a different state from that illustrated in FIG. 13(*a*).

FIG. 14(*b*) is a cross sectional view illustrating a different state from that illustrated in FIG. 14(*a*).

FIG. 14(*c*) is a cross sectional view illustrating a different state from that illustrated in FIG. 14(*a*).

FIG. 14(*d*) is a cross sectional view illustrating a different state from that illustrated in FIG. 14(*a*).

DESCRIPTION OF THE EMBODIMENTS

Figure 1:
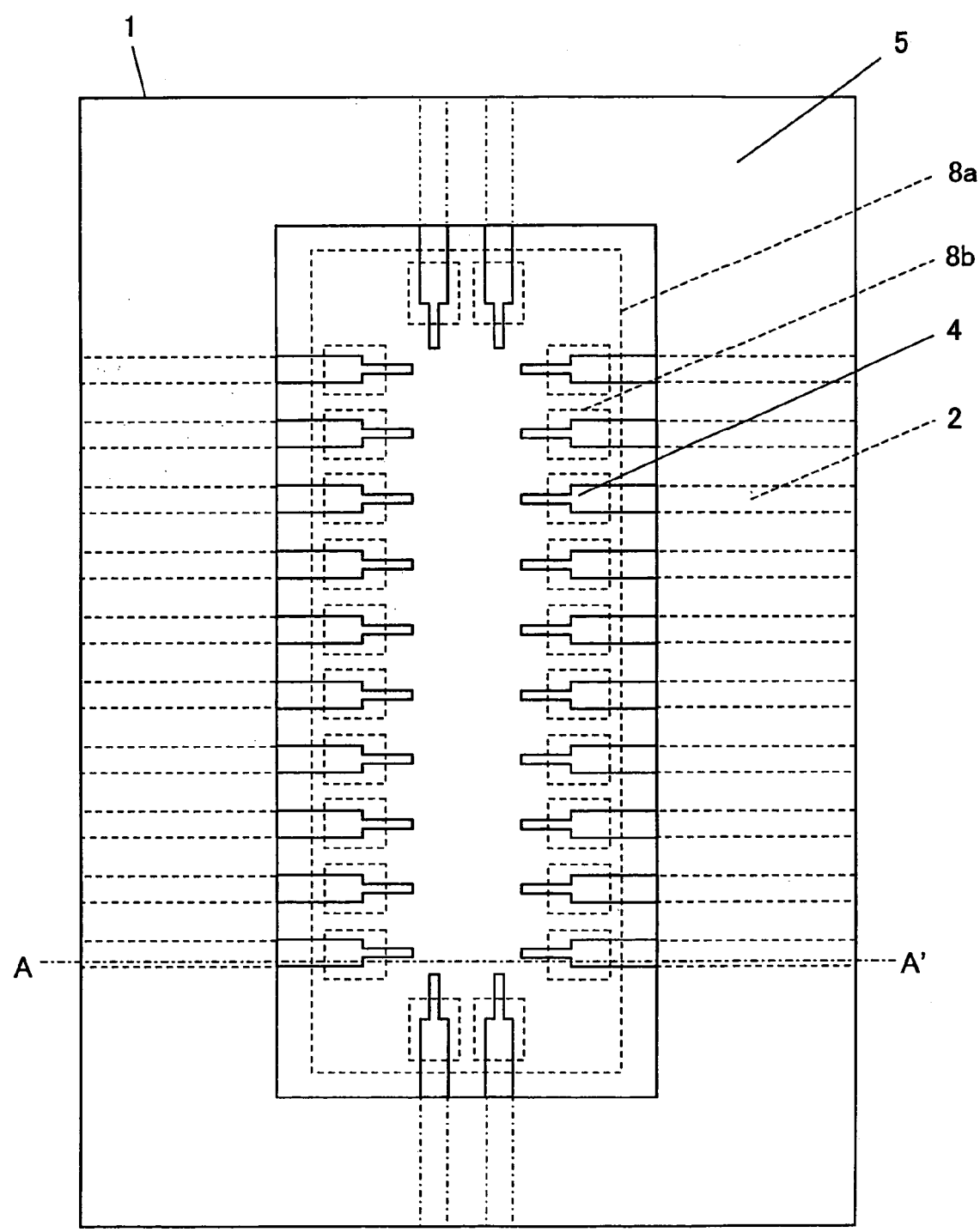
FIG. 1 is a plane view illustrating an insulating tape of a semiconductor device according to an exemplary embodiment of the present invention.

An exemplary embodiment of the present invention (hereinafter, present embodiment) is explain below, referring to drawings.

A COF (Chip ON Film, semiconductor device) 10 of the present embodiment is, e.g. as illustrated in FIG. 2(*d*), provided with a semiconductor element 3 and an insulating tape 1, on which the semiconductor element 3 is located. The semiconductor element 3 is bonded with the insulating tape 1.

More specifically, the insulating tape 1 of the COF 10 is so configured that a wiring pattern 2 is provided on the insulating tape 1 as a substrate, as illustrated in FIGS. 2(a) to 2(d).

The insulating tape 1 of the present embodiment is a polyimide-based insulating tape, and is highly flexible: the insulating tape 1 is freely bendable. The insulating tape 1 is a thin film having a thickness of any one of, e.g., 15, 20, 25, 38, 40 μm, and the like thickness. On a surface of the insulating tape 1 serving as a tape carrier of the substrate, the wiring pattern 2 is formed. No opening section on which the semiconductor element 3 is mounted is provided in the insulating tape 1.

The wiring pattern 2 is, e.g. a copper pattern. On a surface of the copper pattern, tin or gold (not illustrated) is plated. The wiring pattern 2 has a thickness of any one of, e.g., 5, 8, 9, 12, 18 μm, and the like thickness, corresponding to the thickness of the insulating tape 1 and a pitch of the wiring pattern.

A connection section 4 is that region of the wiring pattern 2 which is to face against and be connected with the protrusion electrode 6 when the semiconductor element 3 is mounted on the wiring pattern 2.

Moreover, that portion of the wiring pattern 2 which is outside of the connection section 4 is coated with a solder resist 5. More particularly, the solder resist 5 is so applied on the wiring pattern 2 provided on the insulating tape 1 in such a manner that the solder resist 5 avoids an external connection section (not illustrated). The external connection section is to be connected with a liquid crystal panel, a printed board (not illustrated) or the like. With this, a desired insulation is attained, which avoids unnecessary contact between the semiconductor element 3 and the wiring pattern 2, and other contact.

Figure 2A:
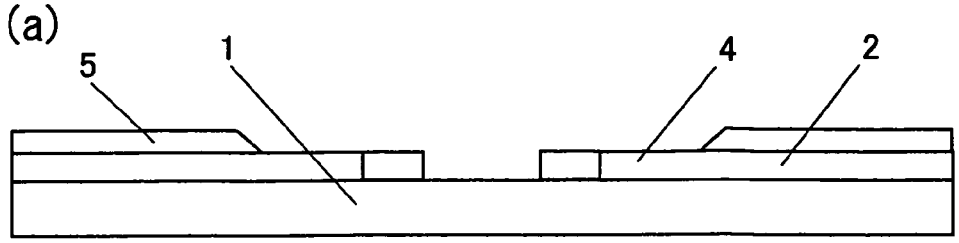
FIG. 2(*a*) is a cross sectional view taken on A-A' of FIG. 1, while FIG. 2(*b*) is a cross sectional view illustrating a different state from that illustrated in FIG. 2(*a*).
Figure 2B:
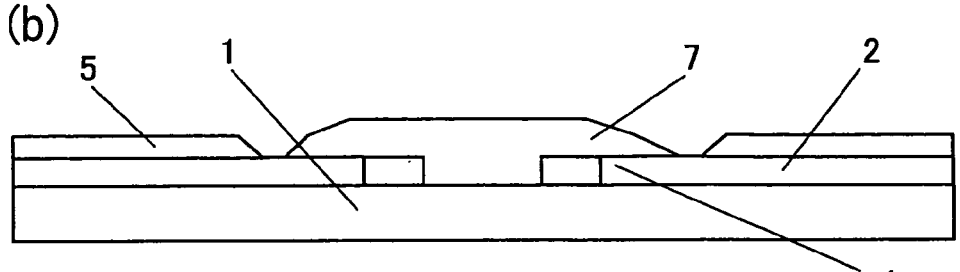

An insulating resin 7 is applied in such a manner that the connection section 4 of the wiring pattern 2 is coated with the insulting resin 7 as illustrated in FIG. 2(b).

Figure 2C:
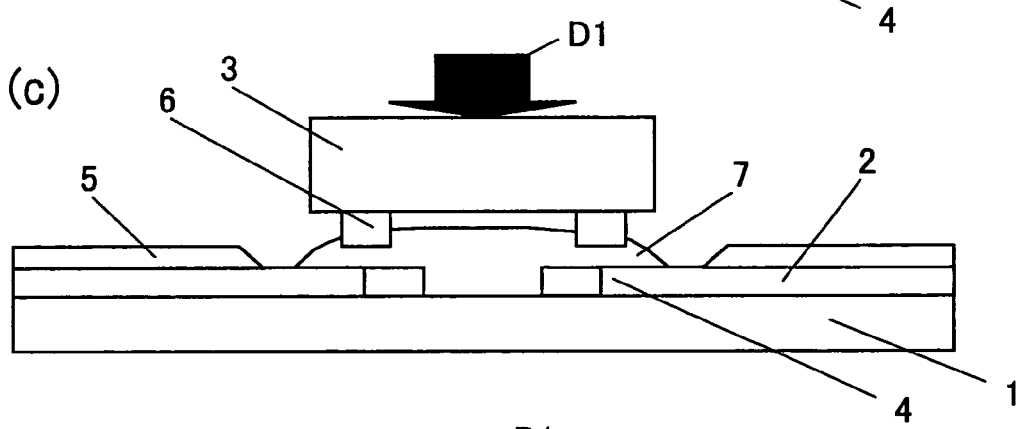

As illustrated in FIG. 2(c), a protrusion electrode (bump) 6 of the semiconductor element 3 is put to face the connection section 4 of the wiring pattern 2, and pressed in Direction D1 by using a pulse heating tool (not illustrated). The pulse heating tool is, e.g. a tool that applies heat while pressure is being applied since the temperature is still normal temperature and stops applying pressure after finishing heating. Direction D1 indicates that the heating is performed while the pressure is being applied.

In the present embodiment, a high pressure of $250 \times 10^{-4}$ gf/um$^2$ or more is applied by way of example. Optimal pressure to be applied varies depending on a width of the wiring pattern, hardness of the protrusion electrode 6, viscosity and hardness property of the insulating resin 7, and the like. Therefore, the value of the pressure mentioned above is merely an example.

Figure 2D:
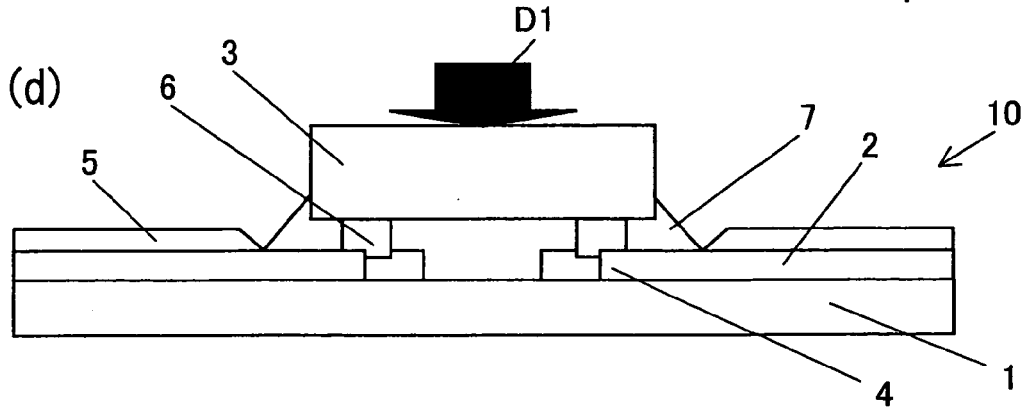

As illustrated in FIG. 2(d), the semiconductor element 3 is bonded with the surface of the insulating tape 1 by heating to approximately 230° C. to 250° C., thereby to mount the semiconductor element 3 thereon. With this, the protrusion electrode 6 of the semiconductor 3 is electrically connected with the corresponding connection section 4 of the wiring pattern 2 provided on the surface of the insulating tape 1. After that, the semiconductor element 3 is sealed by thermosetting of the insulating resin 7. Then, the application of the pressure is stopped after the temperature of the pulse heating tool is lowered to normal temperature.

A constant heating tool may be employed in lieu of the pulse heating tool without problem. The constant heating tool, which is heated to a constant temperature, applies pressure and heat, and stops applying the pressure while still heating. The constant heating tool is excellent in productivity.

FIGS. 2(a) to 2(d) are cross sectional views taken on A-A' of FIG. 1. As illustrated in FIG. 2(d), the protrusion electrode 6 is mainly deformed when the protrusion electrode 6 is positioned to face the wiring pattern 2 and is bonded therewith. The protrusion electrode 6 is so deformed by the pressure (in the direction of D1) that the wiring pattern 2 intrudes into the protrusion electrode 6. When the intrusion occurs, the insulating resin 7 between the protrusion electrode 6 and the wiring pattern 2 is pushed away so that no insulating resin 7 remains between the protrusion electrode 6 and the wiring pattern 2. The insulating resin 7 pushed away from an underneath of the semiconductor 3 forms a filet on a side of the semiconductor element 3.

As described above, the COF 10 of the present embodiment is so configured that the connection section 4 of the wiring pattern 2 of the insulating tape 1 (i) pushes away the insulating resin 7 that is placed between the insulating tape 1 and the semiconductor element 3, and (ii) intrudes into the protrusion electrode 6 of the semiconductor 3, thereby to be bonded with the protrusion electrode 6.

In this way, the wiring pattern 2 is connected with the deformed protrusion electrode 6, thereby attaining firm connection between the wiring pattern 2 and the protrusion electrode 6. Moreover, because the insulating tape 1 and the semiconductor element 3 are intervened with the insulating resin 7, it is possible to prevent wiring pattern 2 of the insulating tape 1 from being in contact with the semiconductor 3 at an undesirable position. Furthermore, heating to approximately 230° C. to 250° C. is sufficient: there is no need of heating to a high temperature of 400° C. or more. Thus, the shrinkage of the wiring pattern 2 is small and cumulative dimensional error unlikely occurs.

The problems located toward the conventional arts (the thermocompression bonding and the NCP and the like methods using the low temperature) can be solve at the same times. It should be noted that the conventional arts such as patent documents 2 and 3 do not give specific description as to the width of the wiring pattern, the intrusion of the wiring pattern into the protrusion electrode and the like.

FIG. 1 is a plane view illustrating the insulating tape 1 of the COF 10. As illustrated in FIG. 1, that region (mounting region) 8a of the insulating tape 1 on which the semiconductor element 3 (not illustrated) is to be mounted is not coated with the solder resist 5. The connection section 4 is that part of the wiring pattern 2 of the insulating tape 1 which is included in a region (facing region) that is to face against the protrusion electrode 6 of the semiconductor element 3 (not illustrated). The connection section 4 has a shape whose width is changed at a point between both ends. More specifically, that portion of the connection section 4 of the wiring pattern 2 which is located toward a middle of the semiconductor element 3 has a narrower width than that portion thereof located toward an outer circumference of the semiconductor element 3.

With this configuration, the wiring pattern 2 is intruded to have a more complex shape when intruded into the protrusion electrode 6 as illustrated in FIG. 2(d) than, e.g., in a case where the wiring pattern 2 has a constant width. This configuration gives much firmer connection.

Moreover, the wiring pattern 2 is positioned from that region of the insulating tape 1 on which the outer circumference of the semiconductor element 3 is to be mounted, toward that region the insulating tape 1 on which the middle of the semiconductor element 3 is to be mounted thus, the connection section 4 has a shape that is to be positioned with respect to the protrusion electrode 6 in such a manner that the shape points toward the middle of the semiconductor element 3.

Figure 3:
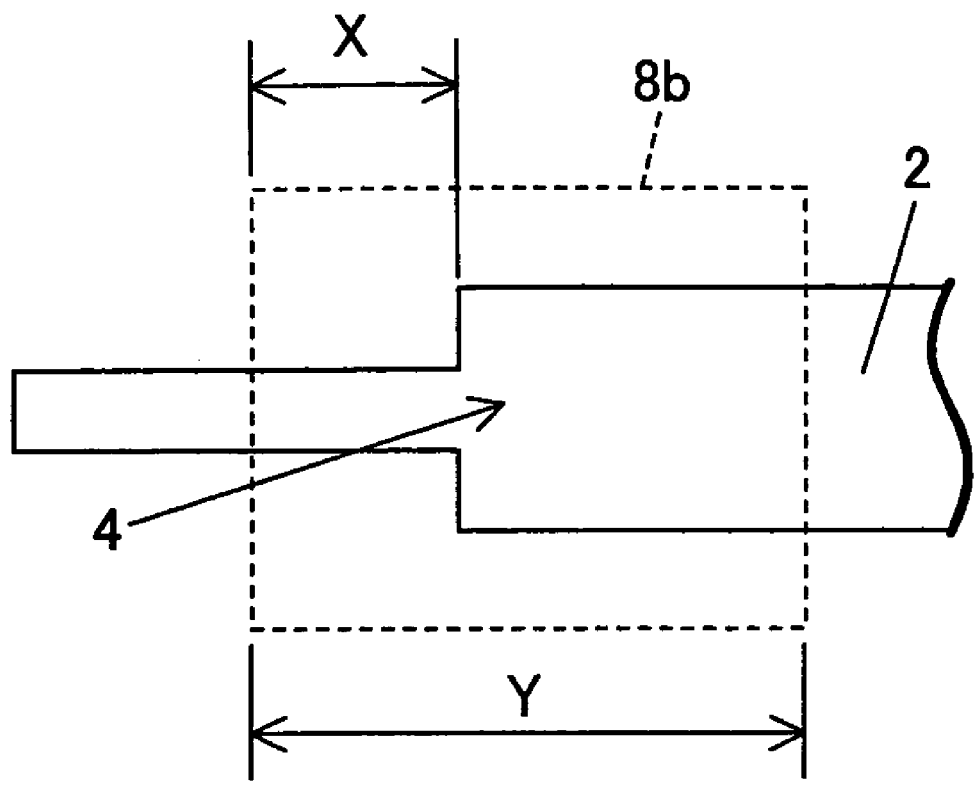
FIG. 3 is a plane view illustrating part of FIG. 1 in enlargement.

More specifically, it is preferable that X approximately satisfies $Y/3 \leq X \leq 2Y/3$, where Y is a length of the region (facing region 8b) facing the protrusion electrode 6 of the semiconductor element 3, and X is that portion of the region which is associated with a narrow-width portion of the wiring pattern 2 on the insulating tape 1, as illustrated in FIG. 3. This configuration makes it easier for the narrow-width portion of the wiring pattern 2 to be in contact with the protrusion electrode 6 of the semiconductor element 3, even when a positional error occurs in bonding the protrusion electrode 6 with the connection section 4 of the wiring pattern 2. For instance, if X is smaller than approximate ⅓ of Y, the above-mentioned effect becomes small. If X is larger than approximate ⅔ of Y, that part of the region which is associated with a wide-width portion of the wiring pattern that is to be intruded into the protrusion electrode 6 becomes small in area, thereby resulting in lower connection strength.

Moreover, the production of the COF 10 of the present embodiment adopts the bonding technique heating to the low temperature of approximately 230° C. to 250° C. This leads to reduction of shrinkage of the wiring pattern 2 including the connection section 4. This reduces the connection failure due to the cumulative dimensional error of the wiring pattern 2.

Moreover, even if the wiring pattern 2 is deformed when the shrinkage or the like occurs, the intervene of the insulating resin 7 between the wiring pattern 2 and the semiconductor element 3 significantly reduces a possibility that the wiring pattern 2 touches the semiconductor element 3. Thereby, it is possible to prevent the "edge touch" (contact failure).

In the COFs produced according to the conventional NCP and the like method, the protrusion electrode and the wiring pattern are bonded by pressing the protrusion to be in contact with the wiring pattern and curing the resin to shrink. Therefore, the COFs produced according to the conventional NCP and the like method has a rather poor connection reliability between the protrusion electrode of the semiconductor element and the wiring pattern of the insulating tape.

On the other hand, the configuration of the COF of the present embodiment allows relatively firm connection. Therefore, with the configuration of the COF of the present embodiment, the connection reliability between the protrusion electrode of the semiconductor element and the wiring pattern of the insulating tape, and the yield are improved as good as the conventional TCP, compared with the conventional NCP and the like method.

Temperature is not only the factor that affects an amount of the shrinkage of the wiring pattern 2. Apart from the temperature, the following factors affects the amount of the shrinkage: the width of the wiring pattern, wiring pattern pitch, spaces between the wiring patterns, a material, the thickness, moisture absorption amount of, the insulating tape, whether preliminary heating is performed or not, heating time including the preliminary heating, and the like. Because there are so many factors affecting the amount of the shrinkage, it is difficult to compare the conventional configuration and the configuration of the present embodiment numerically.

[Modification 1]

A modification of the above embodiment is explained here. Although the above embodiment discuses the COF produced by (i) heating (with low temperature) after pressing, and (ii) curing, the present invention is not limited to this. The COF may be pressed after causing the expansion by heat application, and be cured, as described below. The COF (COF 10a) of the present modification is identical with the above embodiment except that the production is carried out in the different order. For example, the COF (COF 10a) of the present modification has the configuration illustrated in FIG. 1. Therefore, members and means having the same functions are labeled in the same manner, and their explanation is omitted here.

Figure 4A:
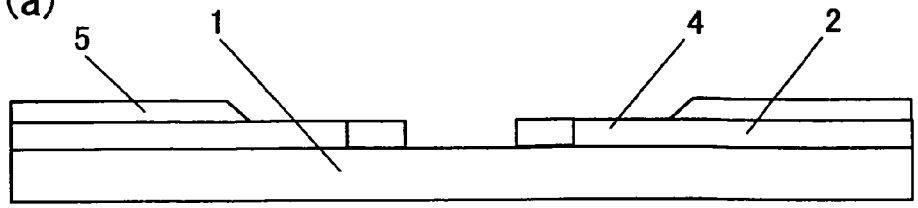
FIG. 4(*a*) is a cross sectional view illustrating a modification of the semiconductor device of FIG. 2.
Figure 4B:
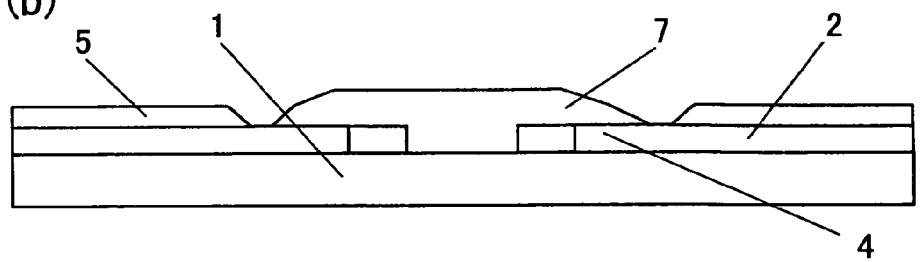

As illustrated in FIGS. 4(a) and 4(b), corresponding to FIGS. 2(a) and 2(b), a wiring pattern 2 is provided on an insulating tape 1 and a connection section 4 is provided. Then, a solder resist 5 is applied and an insulating resin 7 is applied.

Figure 4C:
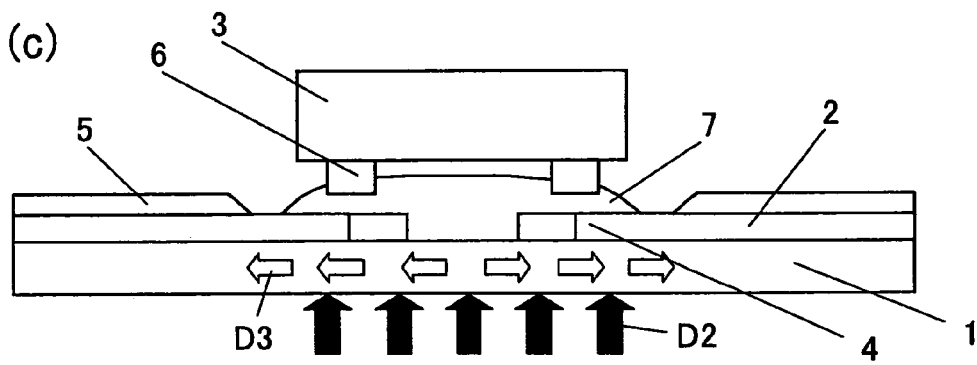

Next, in the present modification, while heat is applied in Direction D2, a protrusion electrode 6 of a semiconductor 3 is positioned to face the connection section 4 of the wiring pattern 2, as illustrated in FIG. 4(c). In this state, the insulating tape 1 and the wiring pattern 2 are thermally expanded as indicated by Direction 3. The protrusion electrode 6 is positioned with respect to the wiring pattern 2 in a position the wiring pattern 2 has when the expansion occurs.

Figure 4D:
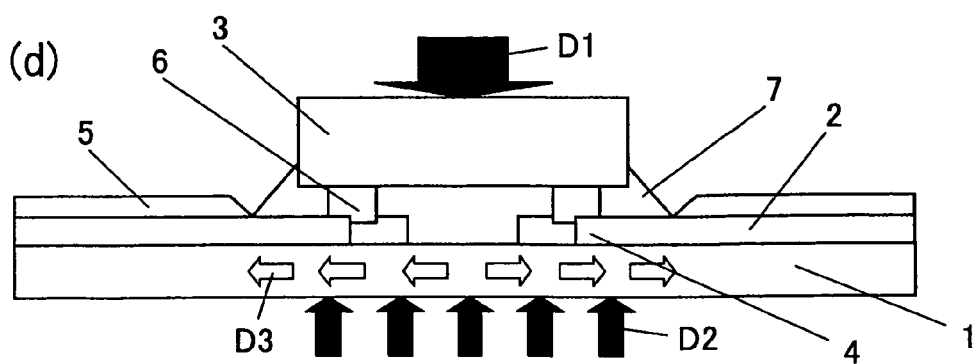

Then, as illustrated in FIG. 4(d), the semiconductor element 3 is heated while being pressed in Direction D1. With this, the protrusion electrode 6 is connected with the wiring pattern 2 in the position which the wiring pattern 2 has when the insulating tape 1 is expanded in Direction D3.

As the heat application proceeds, the insulating resin 7 is thermoset.

Figure 4E:
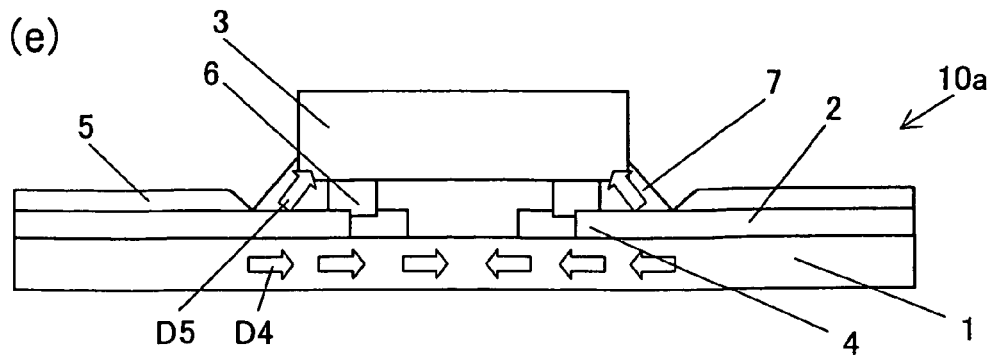

After that, as illustrated in FIG. 4(e), cooling is performed at a normal temperature. The cooling causes the insulating tape 1 to thermally shrink in Direction D4, and the insulating resin 7 to be cured to shrink in Direction D5. The wiring pattern 2, which has the configuration of the connection section 4 illustrated in FIG. 1, is intruded into the protrusion electrode 6, thereby to be connected with the protrusion electrode 6. In the COF 10a of the present modification, the forces in Directions D4 and D5 as illustrated in FIG. 4(e) cause the protrusion electrode 6 of the semiconductor element 3 and the wiring pattern 2 of the insulating tape 1 to be strongly secured (connected) with each other. Specifically, the connection section 4 has a shape that causes the protrusion electrode 6 to be "hooked" with the connection section 4. Thus, it is possible to attain better connection strength. Therefore, it is possible to further improve the connection reliability and yield.

[Modification 2]

Another modification is explained below. In the above embodiment, that portion of the wiring pattern 2 which is to face with the protrusion electrode 6 of the semiconductor element 3 has the shape whose width is changed between both the ends of that portion. More specifically, that portion of the connection section 4 of the wiring pattern 2 which is located toward the middle of the semiconductor element 3 is narrower in width than that portion thereof located toward the outer circumference of the semiconductor element 3.

Figure 5:
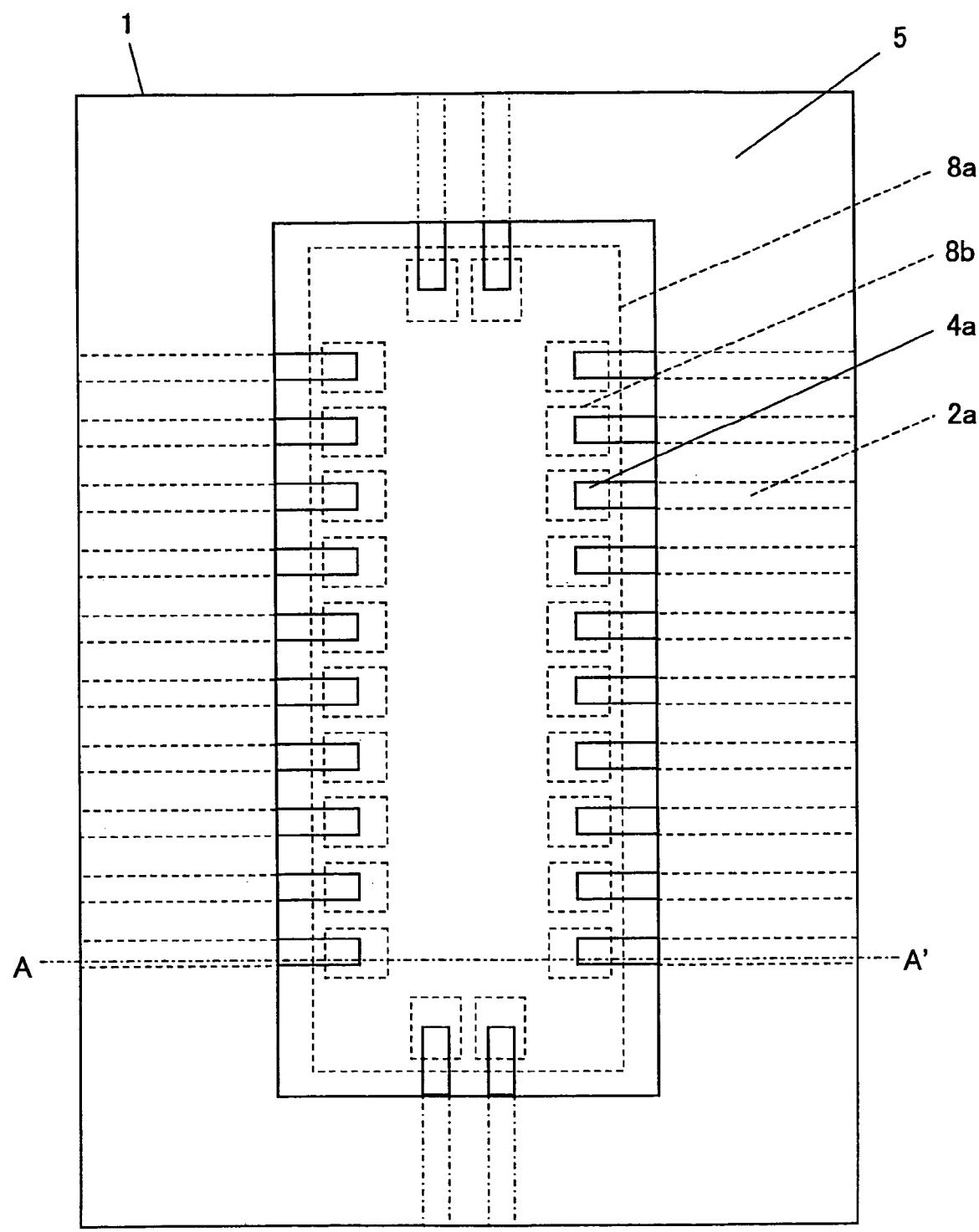
FIG. 5 is a plane view illustrating an insulating tape of another modification of the semiconductor device.

The present invention is not limited to this. As described in the present modification, the wiring pattern may be extended into but not across the region that is to face a protrusion electrode 6 of a semiconductor element 3. That is, a wiring pattern 2 may be configured such that, as illustrated in FIG. 5, a tip portion of the wiring pattern 2 is within a facing region 8b of the wiring pattern 2. Hereinafter, members and means having the same function as these in the above embodiment are labeled in the same manner, and their explanation is omitted here.

An insulating tape 1 of a COF 10b of the present modification is configured such that, as illustrated in FIG. 5, a distance between tip portions, which face each other, of wiring patterns 2a on the insulating tape 1 is longer than a distance between corresponding protrusion electrodes 6 of the semiconductor element 3.

Production of the COF 10b is described below, referring to FIGS. 6(a) to 6(d).

Figure 6A:
FIG. 6(*a*) is a cross sectional view taken on A-A' of FIG. 5.
Figure 6B:
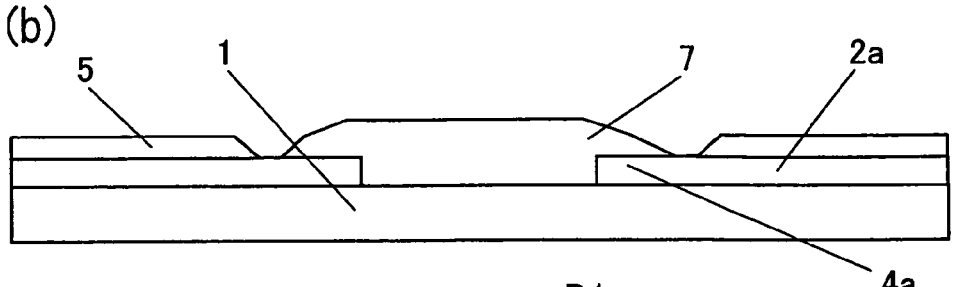

As illustrated with FIGS. 6(a) and 6(b) corresponding to FIGS. 2(a) and 2(b), the wiring pattern 2a having the above-mentioned arrangement is provided on the insulating tape 1, and a connection section 4a is provided. Then, a solder resist 5 is applied, and an insulating resin 7 is applied.

Figure 6C:
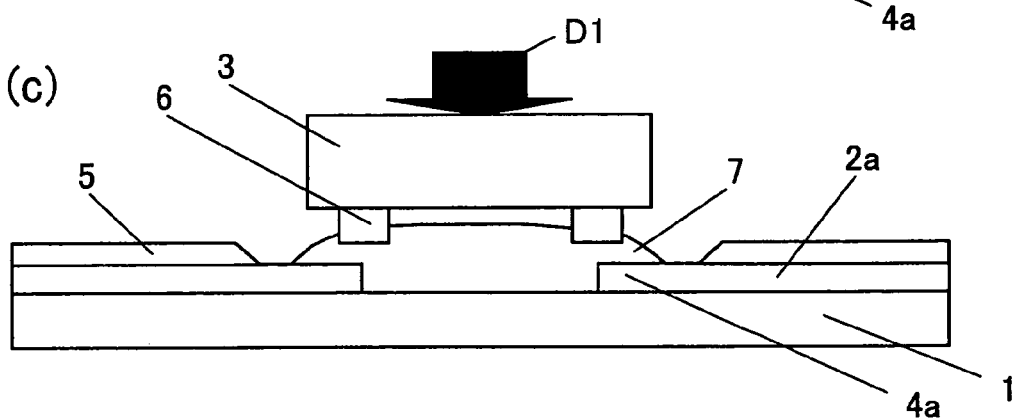

After that, as illustrated in FIG. 6(c), the protrusion electrode (bump) 6 of the semiconductor element 3 is positioned to face the connection section 4a of the wiring pattern 2a. Then, the protrusion element 6 is pressed in Direction D1 by using a pulse heating tool (not illustrated).

Figure 6D:
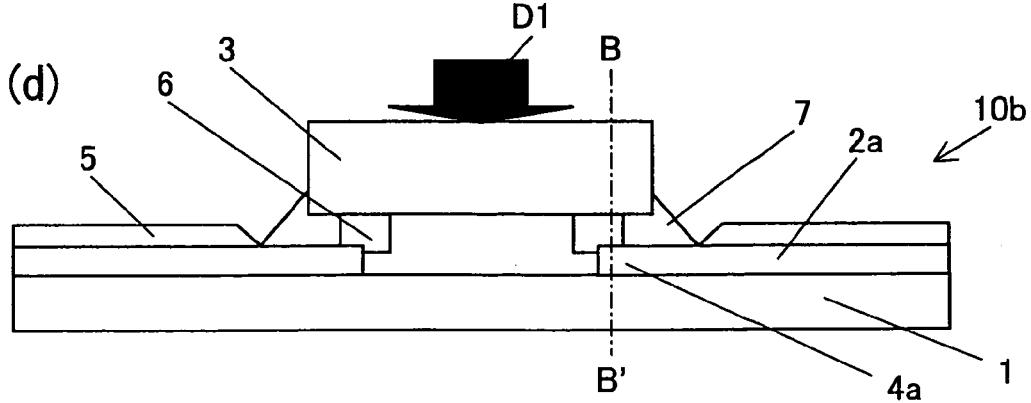

As illustrated in FIG. 6(d), the semiconductor element 3 is bonded with a surface of the insulating tape 1 by heating to approximately 230° C. to 250° C. while pressing. Thereby, the semiconductor element 3 is mounted on the insulating tape 1. With this, the protrusion electrode 6 of the semiconductor element 3 is electrically connected with the corresponding connection section 4a of the wiring pattern 2a provided on the surface of the insulating tape 1. Then, the semiconductor element 3 is sealed as a result of the thermosetting of the insulating resin 7. Thereafter, the pressure is released after the temperature of the pulse heating tool is lowered to approximately a normal temperature.

Figure 7:
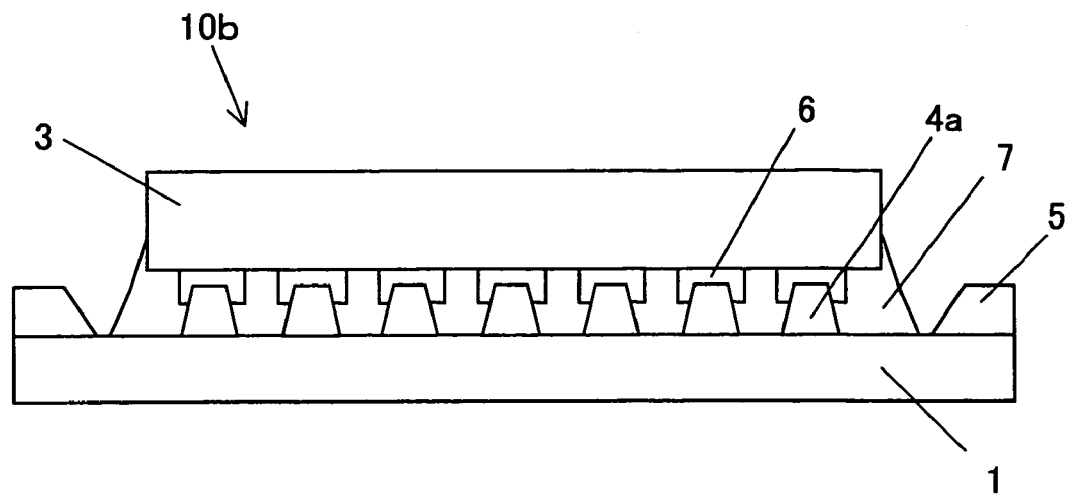
FIG. 7 is a cross-sectional view of the semiconductor device taken on B-B' of FIG. 6(*d*).

As illustrated in FIG. 7, the configuration on a cross section taken on B-B' of FIG. 6(d) is such that the connection section 4a of the wiring pattern 2a is intruded into the protrusion electrode 6.

As described above, in the COF 10b of the present modification, the connection section 4a of the wiring pattern 2a of the insulating tape 1 is shaped such that, as illustrated in FIG. 5, the connection section 4a is extended into but not across the facing region that is to face the protrusion electrode 6 of the semiconductor element 3. This shape of the connection section 4a secures that a predetermined area of the connection section 4a of the wiring pattern 2a touches with the protrusion electrode 6 when the connection section 4a intrudes into the protrusion electrode 6. This attains a predetermined strong connection between the connection section 4a of the wiring pattern 2a and the protrusion electrode 6.

Moreover, because the wiring pattern 2a is extended toward a middle of that region to which the semiconductor element 3 is to be mounted, from an outer circumference of the region. Therefore, the connection section 4a is positioned with respect to the protrusion electrode 6 in such a manner that the connection section 4a is extended toward the middle of the semiconductor element 3.

Figure 8:
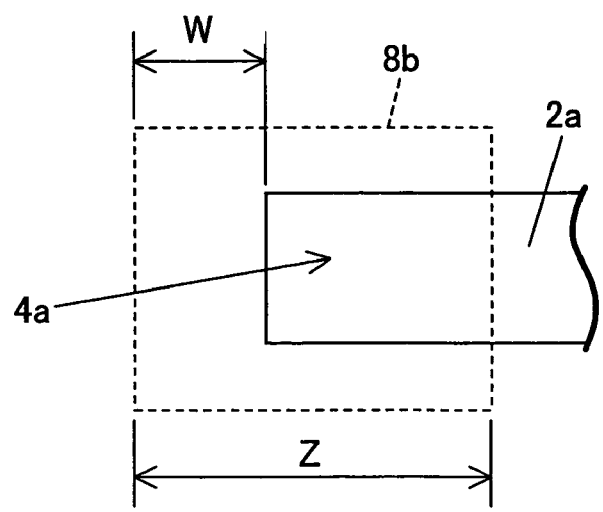
FIG. 8 is a plane view illustrating part of FIG. 5 in enlargement.

More specifically, as illustrated in FIG. 8, it is preferable that W is approximately satisfies $Z/3 \leq W \leq 2Z/3$, where Z is a length of a region (facing region 8b) facing the protrusion electrode 6 of the semiconductor element 3, and W is a length of that portion of the region to which the connection section 4a of the wiring pattern 2a is not provided. With this configuration, a tip portion of the wiring pattern 2a is surely in contact with the connection electrode 6 of the semiconductor element 3 even if misregistration occurs when bonding the protrusion electrode 6 and the connection section 4a of the wiring pattern 2a. For example, if W is smaller than approximately ⅓ of Z, the above effect becomes small. If W is larger than approximately ⅔ of Z, that portion of the region which is associated with the connection section 4a of the wiring pattern 2a that is to be intruded into the protrusion electrode 6 becomes small. This results in lower connection strength.

[Modification 3]

Still another modification is explained below. The present modification is a modification of the modification 2. The above embodiment discusses the case where the width of the wiring pattern 2a is narrower than the portion thereof which is to face the protrusion electrode 6 of the semiconductor element 3. The present invention is not limited to this.

Figure 9:
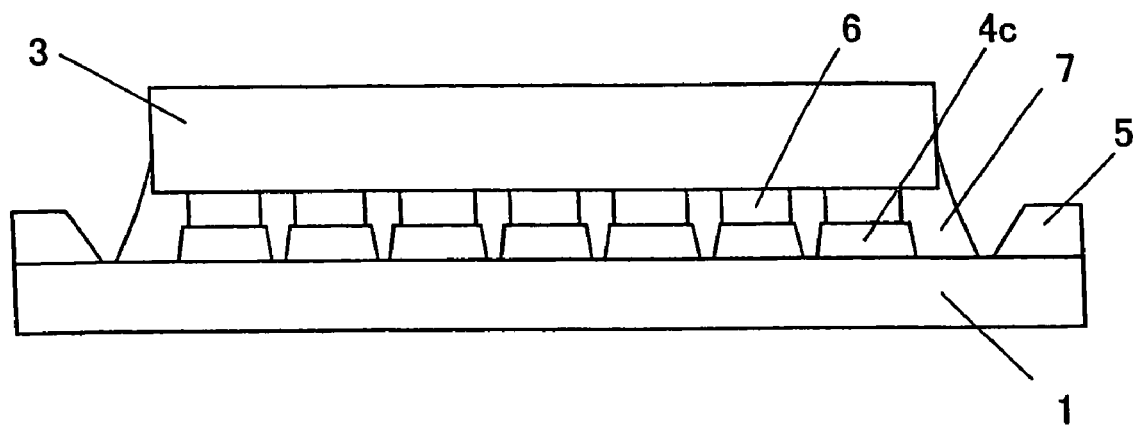
FIG. 9 is a cross sectional view of still another modification of the semiconductor device, different from that illustrated in FIG. 7.

Specifically, as illustrated in FIG. 9, a width of a connection section 4c of the wiring pattern may be thicker than a portion which is to face a protrusion electrode 6 of a semiconductor element 3. FIG. 9 corresponds to the cross section taken on B-B' of FIG. 6(d). In the following, members and means having the same functions as those in the above embodiment are labeled in the same manner and their explanation is omitted.

In this configuration, the width of the wiring pattern 2a is thick, the wiring pattern 2a is extended into but not across a region which is to face the protrusion electrode 6 of the semiconductor element 3. Therefore, in intruding the wiring pattern 2a into the protrusion electrode 6, it is possible to give a predetermined strength to the connection of the connection section 4c of the wiring pattern 2a with the protrusion electrode 6. Therefore, the wiring pattern 2a and the protrusion electrode 6 can be connected with a predetermined strength.

Because the wiring pattern 2a on the insulating tape 1 is connected with the protrusion electrode 6 of the semiconductor element 3 by intruding into or pressing down the protrusion electrode 6 in such a manner that part of the protrusion electrode 6 which is inner with respect to the semiconductor is left intact. Therefore, even if the width of the wiring pattern is larger than the width of the protrusion electrode, it is possible to attain a connection reliability as good as in the case where the wiring pattern has the narrower width.

Here, there are some case where it is difficult to fabricate the wiring pattern 2 of the insulating tape 1 to be narrow. For example, an etching technique of a FPC (Flexible Printed Circuit) maker has a difficulty to fabricate the width of the wiring pattern of the insulating tape to be narrow. In this case, the width of the wiring pattern is thicker than the width of the protrusion electrode of the semiconductor element. In such a case, it is possible to attain a COF having firm connection can be attained by adopting the configuration of the present modification.

Conventional TCP tape makers have no difficulty to fabricate the width of the wiring pattern to be narrow. On the other hand, the conventional NCP and the like method becomes poorer in the connection reliability when the width of the wiring pattern is wider than that of the protrusion electrode, because the connection is established only by (i) the contact caused by the pressure application and by (ii) the shrinkage of the cured resin.

[Modification 4]

Yet another modification is explained below. The present modification is a modification of the modification 2. As described in the present modification, an insulting resin 7a to intervene a semiconductor element 3 and an insulating tape 1 may contain conductive particles 14 dispersed therein. In the following, members and means having the same functions as in the above embodiment are labeled in the same manner and their explanation is omitted here.

Figure 10A:
FIG. 10(*a*) is a cross sectional view illustrating yet another modification of the semiconductor device illustrated in FIG. 6.

As illustrated in FIG. 10(a) corresponding to FIG. 6(a), a wiring pattern 2a is provided on the insulating tape 1. A connection section 4a is provided, and a solder resist 5 is applied.

Figure 10B:
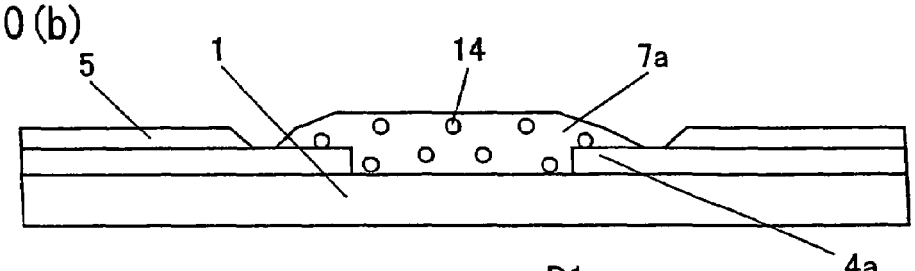

Then, the insulating resin 7a in which the conductive particles 14 are dispersed is applied, as illustrated in FIG. 10(b). A material of the conductive particles 14 is not particularly limited. For example, the conductive particles 14 may be gold-coated resin particles, nickel particles or the like.

Figure 10C:
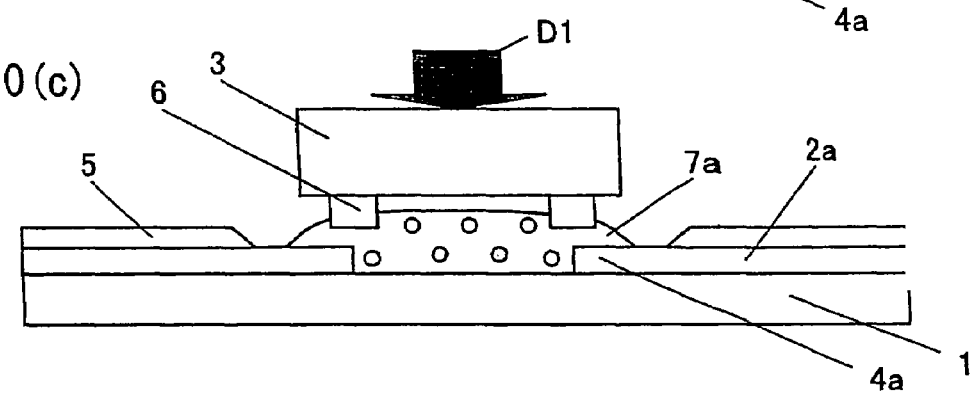
Figure 10D:
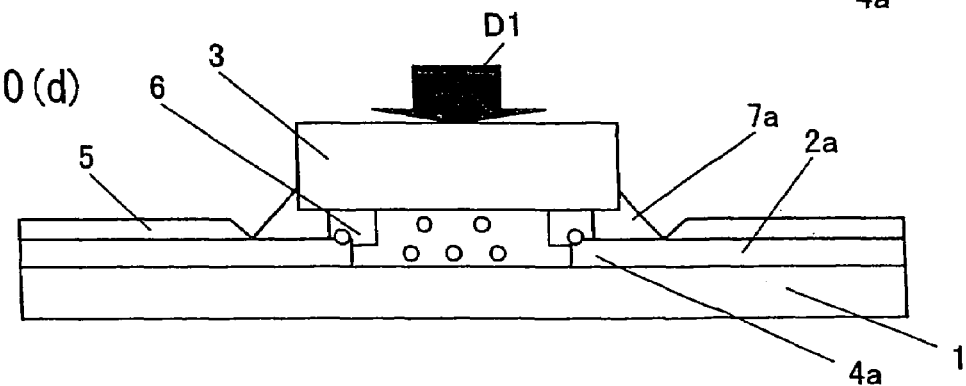
Figure 11:
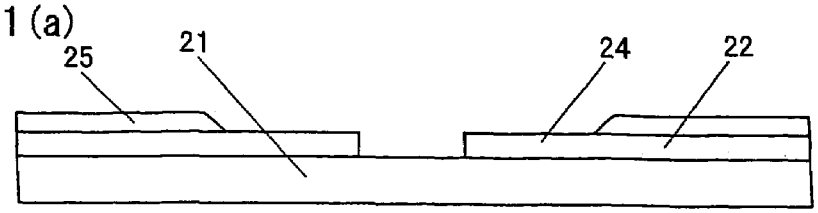
FIG. 11(*a*) is a cross sectional view illustrating an example of a conventional semiconductor device.
Figure 11:
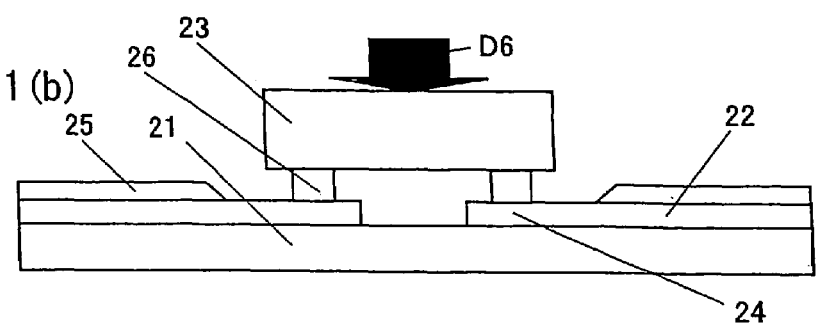
Figure 11:
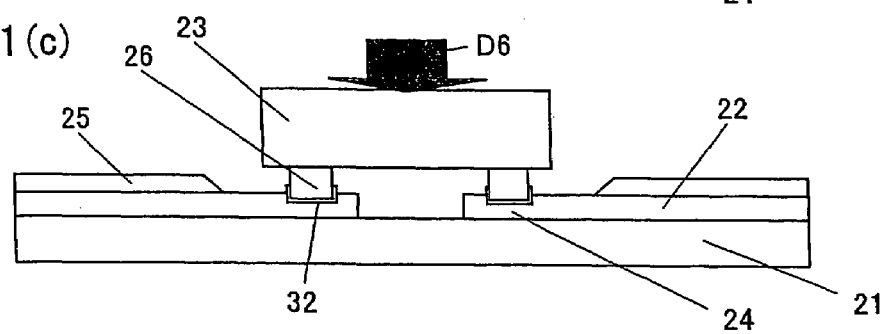
Figure 11:
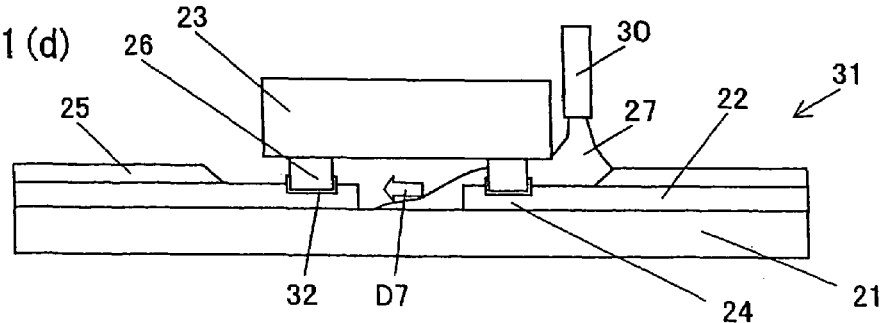
Figure 11:
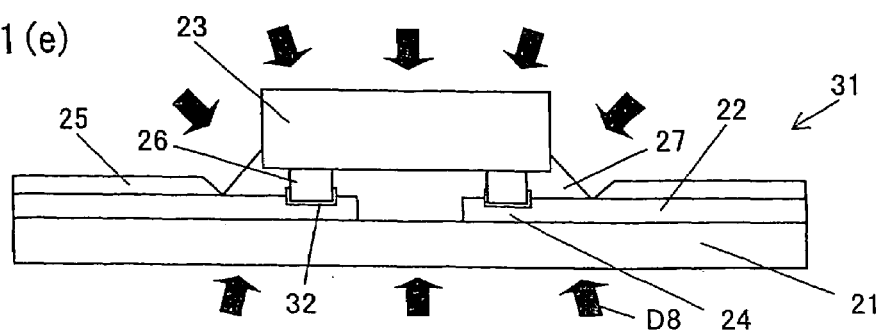
Figure 12:
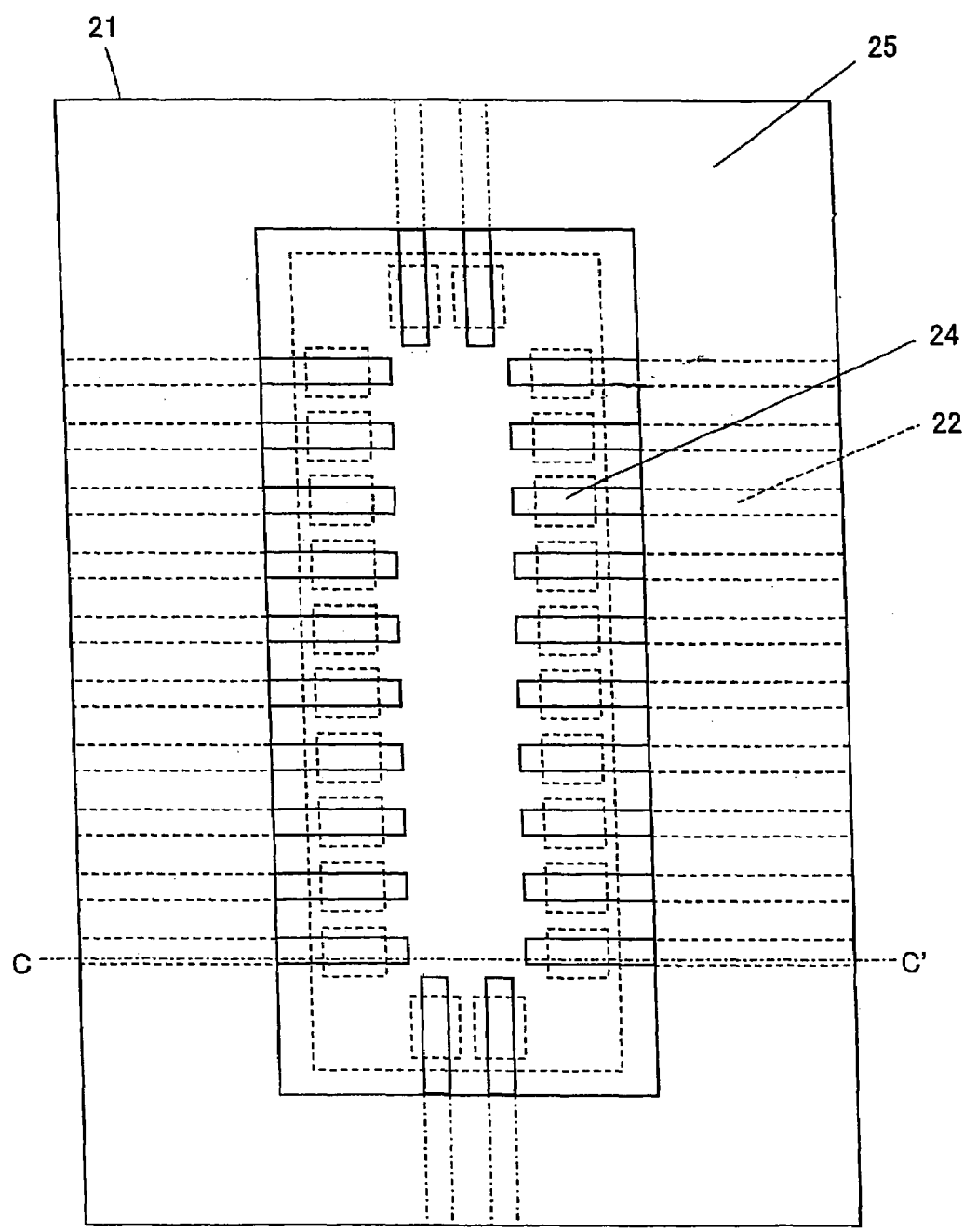
FIG. 12 is a plane view illustrating an insulating tape of an example of the conventional semiconductor device.
Figure 13A:
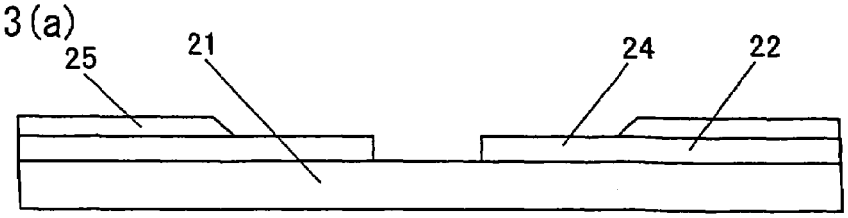
FIG. 13(*a*) is a cross sectional view illustrating another example of the conventional semiconductor device.
Figure 13B:
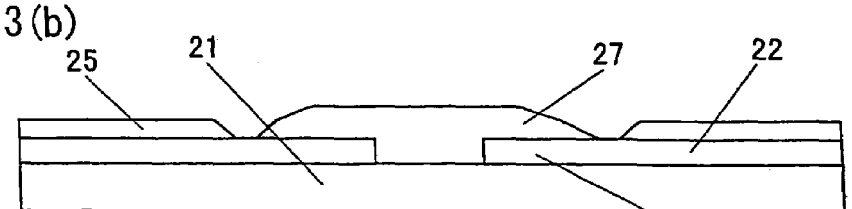
Figure 13C:
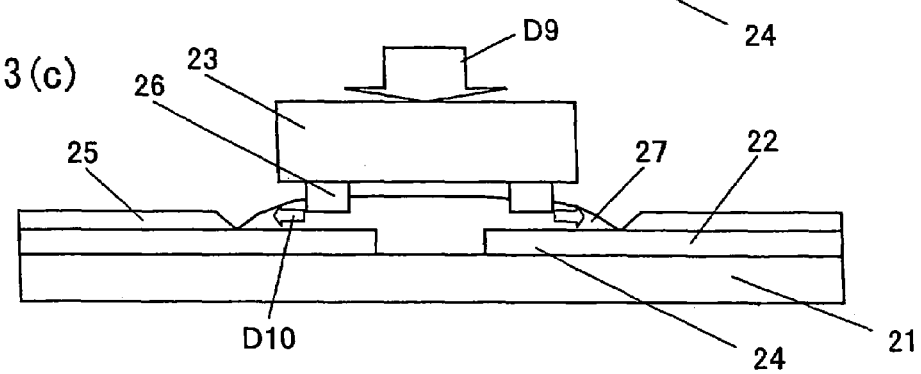
Figure 13D:
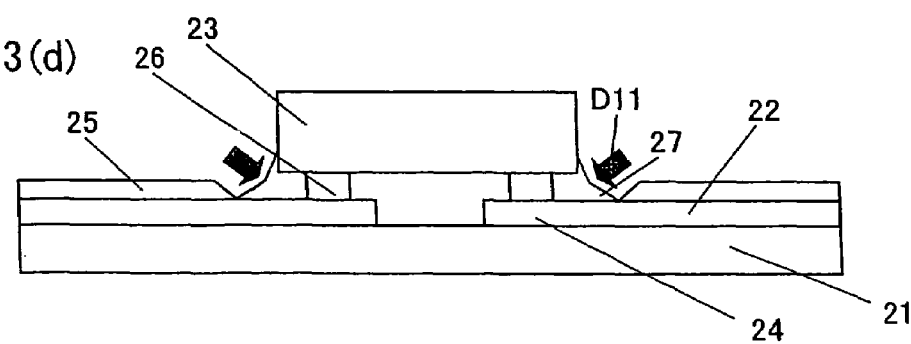
Figure 14A:
FIG. 14(*a*) is a cross sectional view illustrating still another example of the conventional semiconductor device.
Figure 14B:
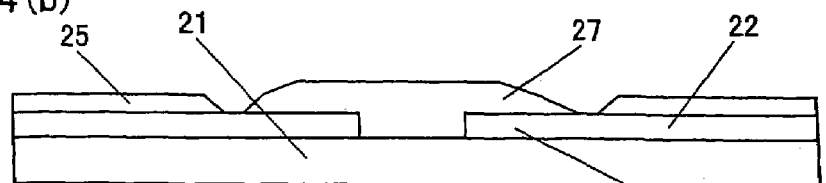
Figure 14C:
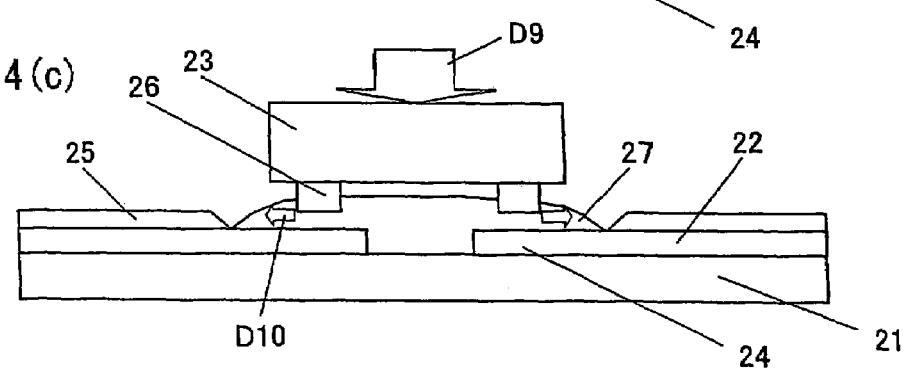
Figure 14D:
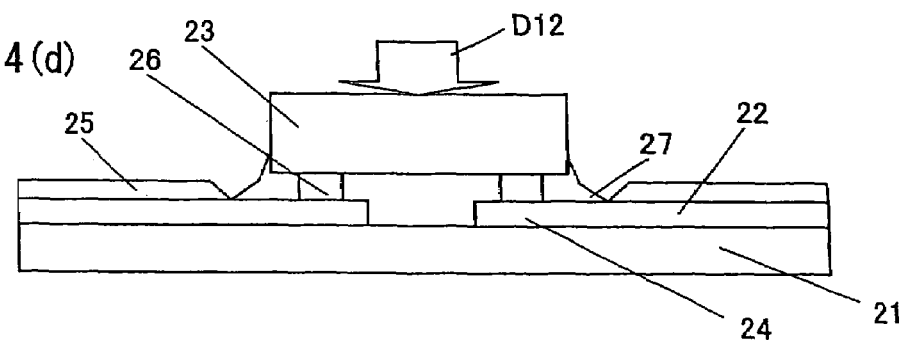

After that, as illustrated in FIG. 10(c), a protrusion electrode (bump) 6 is so positioned to face a connection section 4a of the wiring pattern 2a. Then, the protrusion electrode 6 is pressed in Direction D1 by using a pulse heating tool (not illustrated). As illustrated in FIG. 10(d), the semiconductor element 3 is bonded with and mounted on a surface of the insulating tape 1 by heating to approximately 230° C. to 250° C. while pressing. With this, the protrusion electrode 6 of the semiconductor element 3 is electrically connected with the corresponding connection section 4a of the wiring pattern 2a provided on the surface of the insulating tape 1. Then, the semiconductor element 3 is sealed by thermosetting of the insulating resin 7. Then, pressure is released after a temperature of the pulse heating tool is lowered to about normal temperature.

As described above, a semiconductor device according to present invention is arranged to include an insulating tape on which a plurality of wiring patterns are provided; a semiconductor element having protrusion electrodes that are respectively electrically connected with the insulting tape via the corresponding wiring patterns; an insulating resin provided between the semiconductor element and the insulating tape; and connection sections (i) respectively provided in those facing regions of the wiring patterns which respectively faces the corresponding protrusion electrodes, and (ii) connected with the corresponding protrusion electrodes in such a manner that the connection sections deform and intrude into the corresponding protrusion electrodes, while pushing away the insulating resin.

In the above arrangement, the insulating tape may be extended toward a middle of the semiconductor element from the outer circumference of a region in which the semiconductor element is mounted.

In addition to the above arrangement, a semiconductor device according to the present invention may be arranged such that the connection section of each wiring pattern has a shape different from a shape of that portion of each wiring pattern which is adjacent to the connection section.

With the arrangement in which the shape of the connection section is different from the shape of the portion adjacent to the connection section, the bonding between the connection section and the protrusion section can be strong when the connection section is connected with the protrusion electrode by intruding into the protrusion electrode, because the connection section is used as a hook portion.

On the other hand, if the shape of the connection section is the same as that of the portion adjacent to the connection section, the protrusion electrode will not be hooked by the connection section. Therefore, the strength of the bonding will not be improved so much.

In addition to the above arrangement, a semiconductor device according to the present invention is arranged such that at least part of an edge of the connection section of each wiring pattern is not parallel with a direction in which the each wiring pattern is extended.

With this arrangement in which at least part of the edge of the connection section of each wiring pattern is not parallel with the direction in which the each wiring pattern is extended, the bonding between the connection section and the protrusion section can be strong when the connection section is connected with the protrusion electrode by intruding into the protrusion electrode, because the connection section is used as a hook portion.

On the other hand, if the shape of the connection section is the same as that of the portion adjacent to the connection section, the protrusion electrode will not be hooked by the connection section.

The shape of the edge of the connection section of the wiring pattern may be also described such that there are at least two independent directions parallel to a portion of the edge.

In addition to the above amendment, a semiconductor device according to the present invention is arranged such that the connection sections are at least partly narrower than the wiring patterns in width.

This arrangement allows part of the wiring pattern to be narrow in width and the connection section to be served as the hook section. Thereby, the bonding between the connection section and the protrusion electrode becomes strong.

In addition to the above arrangement, a semiconductor device according to the present invention is arranged such that each connection section has a narrower-width portion and a wider-width portion, the narrower-width portion located toward a middle of the semiconductor element, and the wider-width portion located toward an outer circumference of a region in which the semiconductor element is mounted.

As described above, the wiring pattern may have a narrower-width portion and a wider-width portion, the narrower width portion located toward the middle of the region on which the semiconductor element is mounted. With this arrangement, the connection section serves as a hook section, thereby to attain a strong bonding between the connection section and the protrusion electrode.

The semiconductor device may be described as below: A COF semiconductor device including a thin film insulating tape on which a plurality of wiring patterns are provided, a semiconductor element electrically connected with the wiring patterns, and an insulating resin intervening between the semiconductor element and the insulating tape, protrusion electrodes of the semiconductor element and connection sections of the wiring patterns being connected respectively, the COF semiconductor device arranged such that (i) the wiring patterns having a narrower-width portion, located toward a middle of the semiconductor element and started from a point of a region facing the protrusion electrode, and (ii) when connection of the protrusion electrode and the wiring pattern is carried out while curing the insulating resin, the wiring pattern having the width and shape intrudes into the protrusion electrodes or at least partly deforms the protrusion section thereby to be connected with the protrusion electrode.

In addition to the aforementioned arrangement, a semiconductor device according to the present invention is arranged such that that portion of each facing regions which is associated with the narrower-width portion is not less than ⅓ but not more than ⅔ of the facing regions in length.

With this arrangement, it is easy to cause the narrower-width portion to be in contact with the protrusion electrode of the semiconductor, even if positional misregistration occurs in bonding the protrusion electrode and the connection section of the wiring pattern. For example, if the above ratio is less than ⅓ approximately, the misregistration may cause the narrower-width portion to be off the protrusion electrode. The effect attained in this case would be small. If the ratio is larger than ⅔ approximately, that part of the wider-width portion which intrudes into the protrusion electrode becomes small in area, thereby resulting in weaker connection strength.

The this arrangement may be described as an arrangement in which a length of the narrow-width portion of the wiring pattern is approximately ⅓ to ⅔ of a length of the protrusion electrode.

In addition to the above arrangement, a semiconductor device according to the present invention is arranged such that the connection sections are respectively extended into but not across the facing regions.

As in this arrangement, a region including a tip of the wiring pattern may be including in that region of the wiring pattern which faces the protrusion electrode of the semiconductor element. With this arrangement again, the connection section can serve as a hook section, thereby attaining a strong bonding between the connection section and the protrusion electrode.

In addition to the above arrangement, a semiconductor device according to the present invention is arranged such that the insulating tape is extended toward a middle of the semiconductor element from the outer circumference of a region in which the semiconductor element is mounted; and a distance between tip portions, which face each other, of the wiring patterns on the insulating tape is longer than a distance between the corresponding protrusion electrodes of the semiconductor element.

With this arrangement, the wiring pattern of the insulating tape intrudes into the protrusion electrode of the semiconductor element, leaving part of that portion of the wiring pattern which is located toward the middle of the semiconductor element. With this, the connection sections are so provided that the connection sections are extended toward the middle of the semiconductor element from the outer circumference of the semiconductor element. Thereby, the bonding becomes further strong.

The semiconductor device may be described as below: A COF semiconductor device including a thin film insulating tape on which a plurality of wiring patterns are provided, a semiconductor element electrically connected with the wiring patterns, and an insulating resin intervening between the semiconductor element and the insulating tape, protrusion electrodes of the semiconductor element and connection sections of the wiring patterns being connected respectively, the COF semiconductor device arranged such that (i) a distance between tip portions, which face each other, of the wiring patterns on the insulating tape is longer than a distance between the corresponding protrusion electrodes of the semiconductor element and (ii) when connection of the protrusion electrode and the wiring pattern is carried out while curing the insulating resin, the wiring pattern having the width and shape intrudes into the protrusion electrodes or at least partly deforms the protrusion section thereby to be connected with the protrusion electrode.

In addition to the aforementioned arrangement, a semiconductor device according to the present invention is arranged such that that portions of the facing regions into which the connection sections are respectively extended are not less than ⅓ but not more than ⅔ of the facing regions in length.

With this arrangement, it is easy to cause the narrower-width portion to be in contact with the protrusion electrode of the semiconductor, even if positional misregistration occurs in bonding the protrusion electrode and the connection section of the wiring pattern. For example, if the above ratio is more than ⅔ approximately, the misregistration may cause the tip portion to be off the protrusion electrode. The effect attained in this case would be small. If the ratio is less than ⅓ approximately, that part of the wiring pattern which intrudes into the protrusion electrode becomes small in area, thereby resulting in weaker connection strength.

The above arrangement may be described as an arrangement in which a length of that portion of the wiring pattern of the insulting tape which intrudes into or deform the protrusion electrode so as to be connected with the protrusion electrode is approximately ⅓ to ⅔ of the length of the protrusion electrode.

In addition to the aforementioned arrangement, a semiconductor device according to the present invention is arranged such that a wider-width portion of each wiring pattern has a width narrower than a width of the corresponding protrusion electrode.

When the wider-width portion of the wiring pattern is narrower than the width of the protrusion electrode as in this arrangement, it is possible to have a larger connection area between the wiring pattern and the protrusion electrode, e.g., in case where the shape of the connection section of the wiring pattern is different from the other portion of the wiring pattern than in case where the shape of the connection section is the same as that of the other portion. This arrangement attains better bonding strength.

This arrangement may be described as an arrangement in which the width of the wider-width portion of the wiring pattern of the insulating tape is smaller than the width of the protrusion electrode of the semiconductor element. Moreover, this arrangement may be described as an arrangement in which a width of that end of the wiring pattern which is to be connected with the protrusion electrode of the semiconductor element is smaller than the protrusion electrode.

In addition to the aforementioned arrangement, a semiconductor device of the present invention is arranged such that a wider-width portion each wiring pattern has a width equal to or wider than a width of the corresponding protrusion electrode.

This arrangement makes the present invention applicable to the case where the width of the wiring pattern is wider than the width of the protrusion electrode.

There are some cases where the width of the wiring patterns cannot be fabricated to be thin when the wiring patterns are formed on the insulating tape. With this arrangement, the present invention becomes applicable to such cases, thereby improving the bonding strength therein.

This arrangement may be described as an arrangement in which the width of the wider-width portion of the wiring pattern of the insulating tape is equal to or larger than the width of the protrusion electrode of the semiconductor element. Moreover, this arrangement may be described as an arrangement in which the width of that end of the wiring pattern which is to be connected with the protrusion electrode is equal to or larger than the width of the protrusion electrode.

In addition to the aforementioned arrangement, a semiconductor device according to the present invention is arranged such that the insulating resin comprises conductive particles.

With this arrangement, it is possible to surely attain an electric connection between the protrusion electrode of the semiconductor element and the connection section of the wiring pattern. This arrangement may be described as an arrangement in which conductive particles are dispersed in the insulating resin in advance.

As described above, a method of the present invention for manufacturing a semiconductor device comprising (i) an insulating tape on which a plurality of wiring patterns are provided, and (ii) a semiconductor element having protrusion electrodes that are to be respectively electrically connected with the insulting tape via the wiring patterns, the method comprising: preparing connection sections respectively in those facing regions of the wiring patterns which respectively face the corresponding protrusion electrodes, and providing an insulating resin between the semiconductor element and the insulating tape; and connecting the connection sections respectively with the corresponding protrusion electrodes in such a manner that the connection sections respectively deform and intrude into the corresponding protrusion electrodes, while pushing away the insulating resin.

In addition to the above arrangement, a method of the present invention is arranged such that the step of connecting is performed while the insulating tape is thermally expanded by heating.

With this arrangement, by subjecting the insulating resin to the heat application to be cured and cooling to the normal temperature, the thermal shrinkage of the insulating tape and the curing-induced shrinkage of the insulating resin allow the protrusion electrode of the semiconductor element and the connection section of the wiring pattern to be firmly secured (connected).

The method of this arrangement may be described as a method for manufacturing a COF semiconductor device arranged such that (i) the connecting the wiring pattern of the insulting tape and the protrusion electrode of the semiconductor element is performed in such a manner that the protrusion electrode is connected with the connection section located in a position which the connection section has when the insulting tape is thermally expanded, the insulting tape and the semiconductor element being intervened with the insulating resin, and that (ii) the insulating resin is heated to be cured and then cooled down to a normal temperature. With the method the thermal shrinkage of the insulating tape and the curing-induced shrinkage of the insulating resin allow the protrusion electrode of the semiconductor element and the connection section of the wiring pattern to be firmly secured (connected).

As described above, the wiring pattern of the insulting tape having the aforementioned shape and width intrudes into or partly deforms the protrusion electrode while the connection of the protrusion electrode and the wiring pattern and the curing of the insulating resin are performed at the same time. This gives a relatively strong connection between the protrusion electrode and the connection section. Therefore, compared with the conventional NCP and the like methods, it is possible to attain connection reliability between the protrusion electrode of the semiconductor element and the wiring pattern of the insulating tape and yield as good as the conventional TCP.

The COF produced by thus performing the connection and sealing is a semiconductor device including a thin-film insulating tape on which a plurality of wiring patterns are provided, and a semiconductor element electrically connected with the wiring patterns, the semiconductor element and the insulating tape being intervened with an insulating resin, and a protrusion electrode of the semiconductor element and the wiring pattern of the insulating tape. This semiconductor device have better connection reliability and yield of the wiring pattern, and have any one of the following arrangements (a) to (c):

(a) regardless of which type of material and plating specification of the protrusion electrode of the semiconductor element and the wiring pattern of the insulating tape, the wiring pattern which is connected with the protrusion electrode has a narrower-width portion, which starts from part of the protrusion electrode (approximately the narrower-width portion is extended over ⅓ to ⅔ of the length of the protrusion electrode) and which is located toward a middle of the semiconductor element, and the wiring pattern having the shape and width is connected with the protrusion electrode intrudes into or partly deforms the protrusion electrode while the connection of the protrusion electrode and the wiring pattern and the curing of the insulating resin are performed at the same time;

(b) a distance between tip portions, which face each other, of the wiring patterns on the insulating tape is longer than a distance between the corresponding protrusion electrodes of the semiconductor element, and while the connection of the protrusion electrode and the wiring pattern and the curing of the insulating resin are performed at the same time, the wiring pattern intrudes into or deforms the protrusion electrode, leaving that portion of the protrusion electrode which is located toward the middle of the semiconductor, (the portion is extended over approximately ⅓ to ⅔ of the length of the protrusion electrode); and (c) the connecting the wiring pattern of the insulting tape and the protrusion electrode of the semiconductor element is performed in such a manner that the protrusion electrode is connected with the connection section located in a position which the connection section has when the insulting tape is thermally expanded, the insulting tape and the semiconductor element is intervened with the insulating resin, and the insulating resin is heated to be cured and then cooled down to a normal temperature, whereby the thermal shrinkage of the insulating tape and the curing-induced shrinkage of the insulating resin allow the protrusion electrode of the semiconductor element and the connection section of the wiring pattern to be firmly secured (connected).

By arranging (a) regardless of which type of material and plating specification of the protrusion electrode of the semiconductor element and the wiring pattern of the insulating tape, the wiring pattern which is connected with the protrusion electrode has a narrower-width portion, which starts from part of the protrusion electrode (that part is approximately ⅓ to ⅔ of the length of the protrusion electrode) and which is located toward a middle of the semiconductor element, and the wiring pattern having the shape and width is connected with the protrusion electrode intrudes into or partly deforms the protrusion electrode while the connection of the protrusion electrode and the wiring pattern and the curing of the insulating resin are performed at the same time, (b) a distance between tip portions, which face each other, of the wiring patterns on the insulating tape is longer than a distance between the corresponding protrusion electrodes of the semiconductor element, and while the connection of the protrusion electrode and the wiring pattern and the curing of the insulating resin are performed at the same time, the wiring pattern intrudes into or deforms the protrusion electrode, leaving that portion of the protrusion electrode which is located toward the middle of the semiconductor, (the portion is approximately ⅓ to ⅔ of the length of the protrusion electrode), or (c) the connecting the wiring pattern of the insulting tape and the protrusion electrode of the semiconductor element is performed in such a manner that the protrusion electrode is connected with the connection section located in a position which the connection section has when the insulting tape is thermally expanded, the insulting tape and the semiconductor element is intervened with the insulating resin, and the insulating resin is heated to be cured and then cooled down to a normal temperature, whereby the thermal shrinkage of the insulating tape and the curing-induced shrinkage of the insulating resin allow the protrusion electrode of the semiconductor element and the connection section of the wiring pattern to be firmly secured (connected), it is possible to attain connection reliability between the protrusion electrode and the wiring pattern, and yield as good as the conventional TCP.

As described above, a semiconductor device present invention is arranged such that a connection section is provided in that region of the wiring pattern of the insulating tape which is to face the protrusion electrode of the semiconductor element. The connection section is to introduce into the protrusion electrode, deforming the protrusion electrode. An insulating resin is provided between the semiconductor element and the insulating tape. The protrusion electrode and the connection section is connected in such a manner that the connection section intrudes into the protrusion electrode, pushing away the insulating resin.

With this arrangement, it is possible to have a higher bonding strength between the connection section and the protrusion electrode.

For example, in this arrangement, the shape of the connection section may be different from other portion of the wiring pattern, or the edge of the wiring pattern may not be partly parallel to the direction in which the wiring pattern is extended. Moreover, for example, at least part of the connection section may be narrower. The wiring section may have a leading end that has a narrower width. For example, the tip portion of the wiring pattern may be included in the connection section. By arranging as such, the effect of this arrangement can be improved.

The semiconductor device according to the present invention can have better connection reliability and yield. Thus, the semiconductor device can be manufacture with low cost and is suitable for mass production.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   an insulating tape on which a plurality of wiring patterns are provided;
   a semiconductor element having protrusion electrodes that are respectively electrically connected with the insulating tape via the corresponding wiring patterns;
   an insulating resin provided between the semiconductor element and the insulating tape; and
   connection sections, each of the connection sections (i) respectively provided in those facing regions of the wiring patterns which is directly under the surface of the corresponding protrusion electrodes that faces the insulating tape, and (ii) connected with the corresponding protrusion electrodes in such a manner that the connection sections deform and intrude into the corresponding protrusion electrodes, while pushing away the insulating resin;
   wherein
      each connection section has a narrower-width portion and a wider-width portion, the narrower-width portion located toward a middle of the semiconductor element, and the wider-width portion located toward an outer circumference of a region in which the semiconductor element is mounted, and that portion of each facing regions which is associated with the narrower-width portion is not less than ⅓ but not more than ⅔ of a length of the facing regions.

2. A semiconductor device as set forth in claim 1, wherein:
   the connection section of each wiring pattern has a shape different from a shape of that portion of each wiring pattern which is adjacent to the connection section.

3. A semiconductor device as set forth in claim 1, wherein:
   at least part of an edge of the connection section of each wiring pattern is not parallel with a direction in which the each wiring pattern is extended.

4. A semiconductor device as set forth in claim 1, wherein:
   the connection sections are at least partly narrower than the wiring patterns in width.

5. A semiconductor device as set forth in claim 1, wherein:
   a wider-width portion of each wiring pattern has a width narrower than a width of the corresponding protrusion electrode.

6. A semiconductor device as set forth in claim 1, wherein:
   a wider-width portion each wiring pattern has a width equal to or wider than a width of the corresponding protrusion electrode.

7. A semiconductor device as set forth in claim 1, wherein:
   the insulating resin comprises conductive particles.

8. A semiconductor device as set forth in claim 1, wherein the protrusion electrodes and the connection sections are respectively connected by thermal shrinkage of the insulating tape and curing-induced shrinkage of the insulating resin.

9. A semiconductor device comprising:
   an insulating tape on which a plurality of wiring patterns are provided;
   a semiconductor element having protrusion electrodes that are respectively electrically connected with the insulating tape via the corresponding wiring patterns;
   an insulating resin provided between the semiconductor element and the insulating tape; and
   connection sections, each of the connection sections (i) respectively provided in those facing regions of the wiring patterns which is directly under the surface of the corresponding protrusion electrodes that faces the insulating tape, and (ii) connected with the corresponding protrusion electrodes in such a manner that the connection sections deform and intrude into the corresponding protrusion electrodes, while pushing away the insulating resin;
   wherein the connection sections are respectively extended into but not across the facing regions, and those portions of the facing regions into which the connection sections are respectively extended are not less than ⅓ but not more than ⅔ of a length of the facing regions.

10. A semiconductor device as set forth in claim 9, wherein:
    the insulating tape is extended toward a middle of the semiconductor element from the outer circumference of a region in which the semiconductor element is mounted; and
    a distance between tip portions, which face each other, of the wiring patterns on the insulating tape is longer than a distance between the corresponding protrusion electrodes of the semiconductor element.

11. A semiconductor device as set forth in claim 9, wherein the protrusion electrodes and the connection sections are respectively connected by thermal shrinkage of the insulating tape and curing-induced shrinkage of the insulating resin.

* * * * *